US007939350B2

United States Patent
Tsai

(10) Patent No.: US 7,939,350 B2
(45) Date of Patent: May 10, 2011

(54) METHOD FOR ENCAPSULATING A SUBSTRATE AND METHOD FOR FABRICATING A LIGHT EMITTING DIODE DEVICE

(75) Inventor: Bin-Hong Tsai, Kaohsiung (TW)

(73) Assignee: E. I. du Pont de Nemours and Company, Wilmington, DE (US)

( * ) Notice: Subject to any disclaimer, the term of this patent is extended or adjusted under 35 U.S.C. 154(b) by 361 days.

(21) Appl. No.: 12/341,037

(22) Filed: Dec. 22, 2008

(65) Prior Publication Data
US 2009/0176324 A1   Jul. 9, 2009

(51) Int. Cl.
*H01L 21/00* (2006.01)
(52) U.S. Cl. ....... 438/28; 257/82; 257/88; 257/E33.001; 257/E21.001; 257/E23.116
(58) Field of Classification Search ............. 438/25–28, 438/15, 51, 55, 64, 106, 112, 124–127; 257/79, 257/82, 88, 100, 433, 918, E51.02, E31.117, 257/E23.087, E21.499–E21.504, E21.001, 257/E33.059, E33.001, 667, 787–790, 796, 257/E23.066, E23.092, E23.116–E23.135
See application file for complete search history.

(56) References Cited

U.S. PATENT DOCUMENTS

| | | | |
|---|---|---|---|
| 5,478,699 A | 12/1995 | Blessington et al. | |
| 6,286,941 B1 | 9/2001 | Courian et al. | |
| 6,858,474 B1 | 2/2005 | Koay et al. | |
| 2007/0045761 A1* | 3/2007 | Basin et al. | 257/440 |
| 2007/0064420 A1 | 3/2007 | Ng et al. | |

FOREIGN PATENT DOCUMENTS
EP   1 854 864 A1   11/2007
* cited by examiner

*Primary Examiner* — A. Sefer
*Assistant Examiner* — Monica D Harrison
(74) *Attorney, Agent, or Firm* — Konrad H. Kaeding

(57) ABSTRACT

The present invention relates to a method for encapsulating a substrate, which comprises:
 (a1) providing a substrate with a plurality of chips mounted on a top of the substrate;
 (b1) compressing a dry film photoresist on the top side of the substrate to form a photoresist layer;
 (c1) exposing the photoresist layer to a light source through a mask to form unexposed photoresist regions and exposed photoresist regions;
 (d1) developing the photoresist layer to uncover underlying portions of the unexposed photoresist regions;
 (e1) molding the top side of the substrate with a molding material;
 (f1) curing the molding material; and
 (g1) removing the unexposed photoresist regions from the substrate with a photoresist-removing agent.

16 Claims, 5 Drawing Sheets

ND FOR FABRICATING A LIGHT EMITTING DIODE DEVICE

METHOD FOR ENCAPSULATING A SUBSTRATE AND METHOD FOR FABRICATING A LIGHT EMITTING DIODE DEVICE

FIELD OF THE INVENTION

The present invention relates to encapsulation of a substrate by utilizing a dry film photoresist and photolithography technique. Moreover, the present invention relates to fabrication of a light emitting diode (LED) device.

BACKGROUND OF THE INVENTION

Wirebonding has been a mainstream process for fabrication of electronic packages and assemblies since the 1950s. Wirebonding provides electrical connection of microelectronic components in an electronic device via very fine bonding wires, which are usually 1 to 3 mils in diameter and made of gold (Au), aluminum (Al) or copper (Cu). The methods presently used in wirebonding include, for example, thermocompression, ultrasonic method and thermosonic method. Publications with respect to wirebonding include, for example, U.S. Pat. No. 6,858,474. It has been found that wirebonding has the following common failings:

Cratering or peeling of a wirebond pad
Wirebond fracture (which leads to weak bonds or bond lifts)
Inconsistent tails (which cause shorts with other bonds or traces on the surrounding circuitry)
Poor welding (which leads to weak bonds)
Improper positioning on the bond pad (which leads to shorts and bad welds)

Besides, conventional wirebonding package is single-side cooled and normally requires heat sinking, which needs extra substrate space.

Over the past five decades, the growth of the semiconductor 30 industry has been truly remarkable, paced to a large extent by equally remarkable progress in the integration, subminiaturization and heat dissipation of integrated circuits (ICs). Wirebonding no longer satisfies the needs of modern electronic packages and assemblies.

Accordingly, flip-chip packaging has been developed as a replacement. Flip-chip packaging provides many advantages, for example, good conductivity, good heat dissipation and minimized chip size. In addition, flip-chip packaging offers benefits over standard wirebonding. For example, flip-chip packaging enables the creation of high-pinout and high-speed designs that are not achievable in standard wirebonding. Moreover, flip-chip packaging reduces the transmitting distance of electronic signals between components and a substrate. Nowadays, flip-chip packaging is widely used in fabrication of electronic packages and assemblies.

It is commonly known to form a conformal coating to protect IC packages from environmental and mechanical damages. A conformal coating keeps the components contained in IC packages away from moisture, solvent abrasion and so on, and thus prolongs the life of the components. Conformal coatings are usually applied by dipping, spraying or simple flow coating. However, the coatings formed on undesired portions of the IC packages cannot be easily removed unless by applying mechanical force, for example, by scarping.

There is still a need for a method for encapsulating a substrate in which the resist layer in undesired regions of a substrate can be easily removed.

In another aspect, light emitting diode (LED) is a semiconductor component that has been broadly used as a light emission device. One prior art device employs multiple LEDs in a single housing to produce a proper light output. The drawback of this type of LED is that the light output is insufficient. To address this drawback, it has been suggested that a single LED be used as a replacement of multiple LEDs. For example, US 2007/00064420 A1 discloses an enhanced light output LED device, which comprises multiple LEDs, each with its own dome (lens). However, such type of LED requires a higher current while the light output is not optimized for power consumption.

LEDs, which emit white light, are desirable. To create white light, it is known to fabricate a light emitting package that contains a plurality of LED chips with evenly mixed colorful lights, for example, red, green and blue lights. It is also known to employ a conformal coating technique in fabrication of LEDs. For example, US 2007/0045761 A1 discloses a method for producing a white light LED which comprises providing an LED die that emits a light having a blue or shorter wavelength, conformably coating the LED die on a plurality of surfaces with a first phosphor for converting the LED light to a first color component of white light, and substantially encapsulating the LED die having the conformal coating with a second phosphor in a transport binder. In US 2007/0045761 A1, a photoresist is deposited over the surface of a support substrate and removed from the surfaces of the LED dice where phosphor is to be deposited. The LED dice is then immersed in a solution containing charged phosphor particles for conformably coating the surfaces of the LEDs with the phosphor. The disadvantage of the method of US 2007/0045761 A1 is that it is only suitable for very thin conformal phosphor layer coating and the silicon encapsulant materials is only UV sensitive types.

In addition to a conformal coating technique, a screen-printing technique is commonly employed in the fabrication of LEDs to provide a conformal coating on each LED. For example, U.S. Pat. No. 5,478,699 teaches a method for fabricating an electrical substrate in which a screen-printing stencil is used. However, the screen-printing technique requires precise alignment and thus increases the difficulty of processing. Moreover, stencils used in the screen-printing technique tend to expand when heated and to shrink when cooled.

It is desirable that LEDs can perform optimized light output and be manufactured without the problem associated with alignment. It is also desirable that the cost of production can be reduced.

SUMMARY OF THE INVENTION

The present invention relates to encapsulation of a substrate by utilizing a dry film photoresist and photolithography technique. The present invention further relates to fabrication of a LED device.

DETAILED DESCRIPTION OF THE INVENTION

The present invention provides a method for encapsulating a substrate, which comprises:
(a1) providing a substrate with a plurality of chips mounted on top side of the substrate;
(b1) compressing a dry film photoresist on the top side of the substrate to form a photoresist layer;
(c1) exposing the photoresist layer to a light source through a mask to form unexposed photoresist regions and exposed photoresist regions;
(d1) developing the photoresist layer to uncover underlying portions of the unexposed photoresist regions;
(e1) molding the top side of the substrate with a molding material;
(f1) curing the molding material; and
(g1) removing the unexposed photoresist regions from the substrate with a photoresist-removing agent.

Any substrate useful in the fabrication of electronic elements is applicable to the present invention. For example, the substrate can be an indium tin oxide (ITO) glass, silicon, silicon oxide, silicon nitride, GaN, Sapphire, InGaN, AlInGaP, or ceramics.

In step (a1), the chips can be mounted on the substrate in flip-chip manner or in wirebonding manner. The chips can be, for example, LED chips, CMOS image sensor chips.

Any known negative type dry film photoresist can be applied to step (b1) of the present invention. Examples of commercially available dry film photoresists include, but are not limited to, photosensitive acrylate, DuPont Riston®, MPF®.

In step (c1), the mask can carry any desired pattern consisting of opaque and clear features. The pattern defines the regions of the photoresist to be exposed to the light source. The light source can be, for example, infrared light, broadband ultraviolet light, deep ultraviolet light, extra ultraviolet light, e-beam and x-rays.

Step (d1) is carried out with a developing solution. Any known developing solution can be applied to step (d1) of the present invention. Preferably, an aqueous solution of sodium carbonate having a concentration of 0.1 to 1.5 v/v % is used in the developing step.

Step (e1) can be carried out in any known molding manner, for example, by inkjet-printing or screen-printing. If this step is carried out by inkjet-printing, a printing apparatus disclosed in, for example, U.S. Pat. No. 6,286,941 B1 can be used.

Any known molding material can be applied to the present invention. Suitable molding materials include, but are not limited to, silicon, epoxy and acrylate. Preferably, the molding materials form a conformal coating on the chips mounted on the top side of the substrate.

Step (f1) can be carried out by heating the substrate or subjecting the substrate to a light source mentioned above, depending on the nature of the molding material described in step (e1).

Figure 1A:
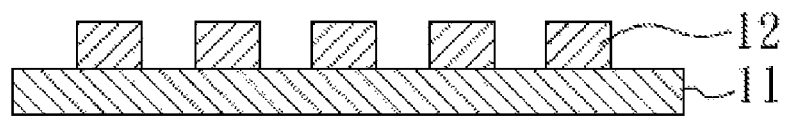
FIG. 1a to 1e are sectional views for explaining the method according to the present invention.
Figure 1B:
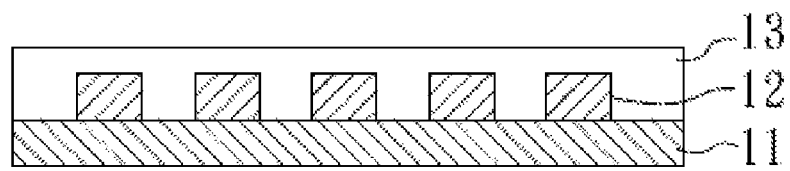
Figure 1C:
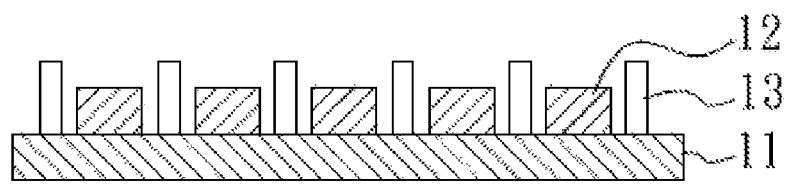
Figure 1D:
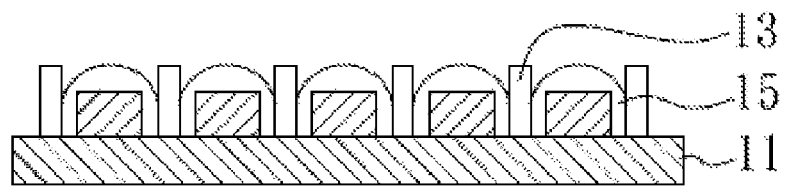
Figure 1E:
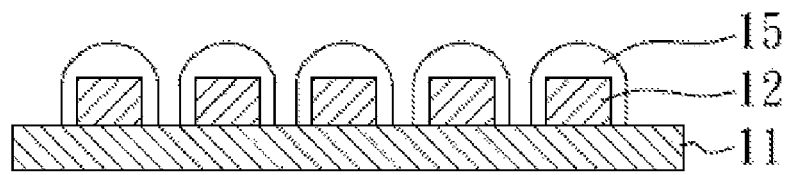
Figure 2:
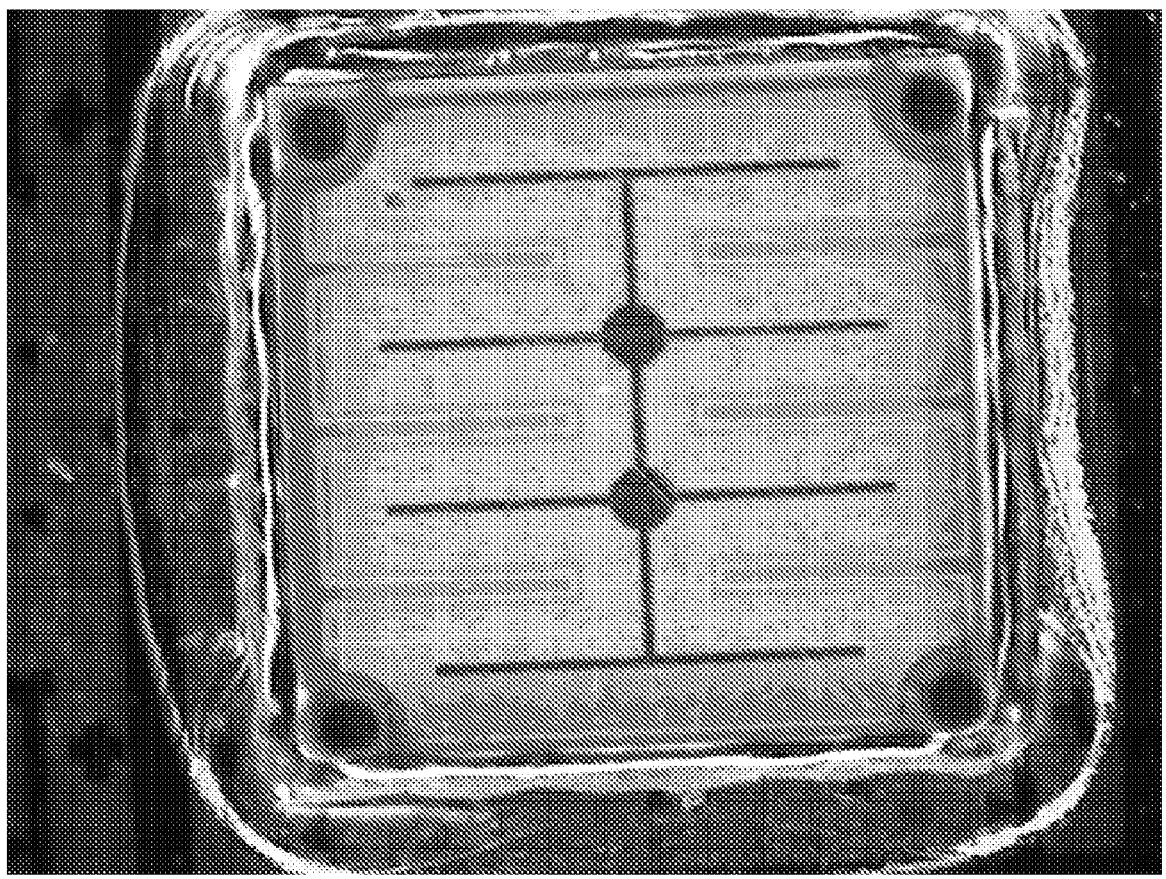
FIG. 2 is a photo of the topside of a chip encapsulated with the method according to the present invention.
Figure 3:
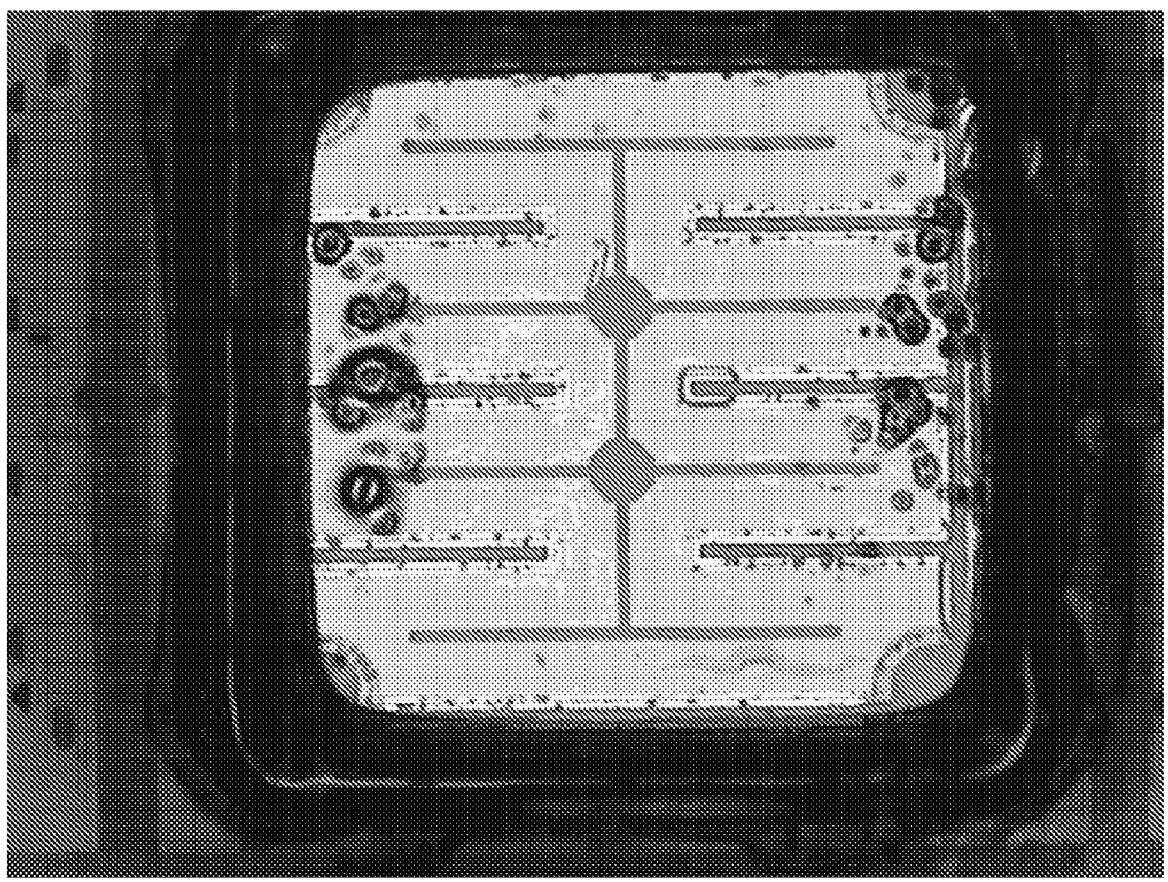
FIG. 3 is a photo of the topside of another chip encapsulated with the method according to the present invention.
Figure 4:
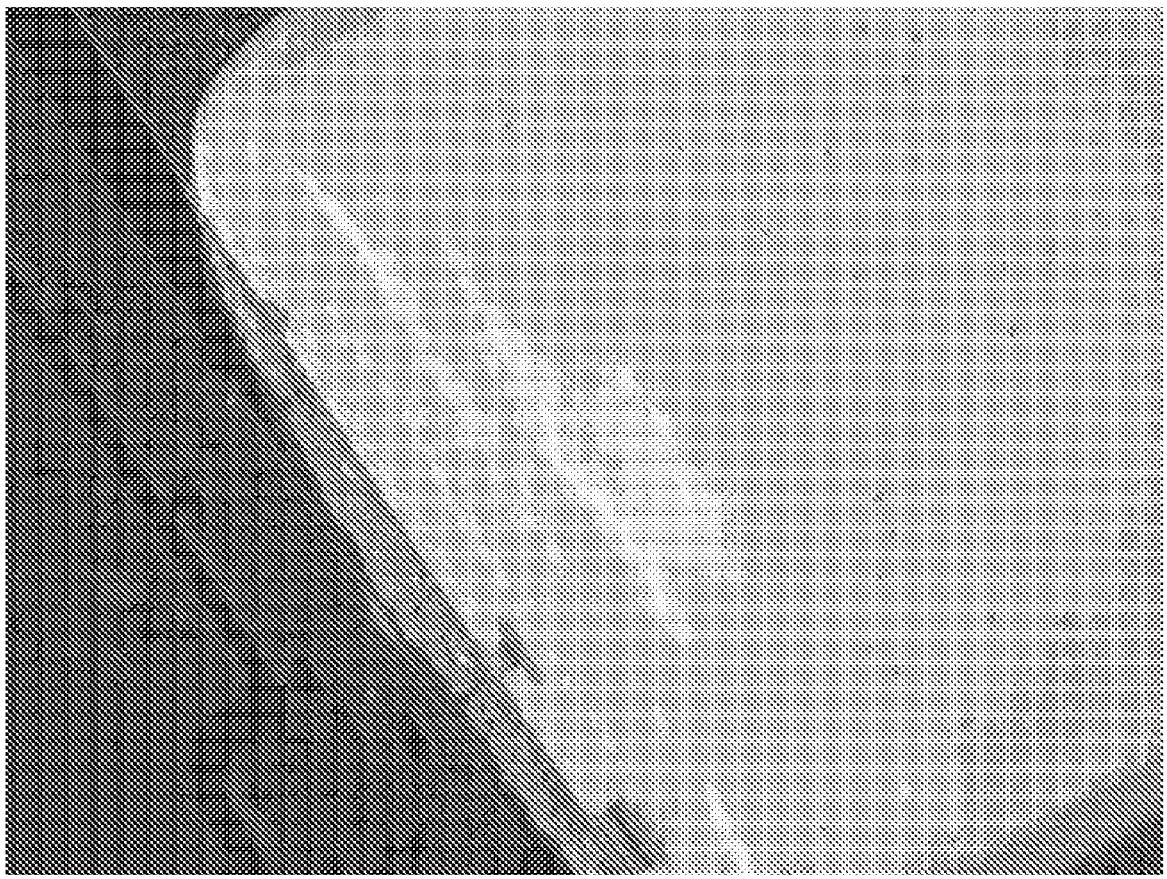
FIG. 4 is a photo of final chip device encapsulated with silicon phosphor.
Figure 5:
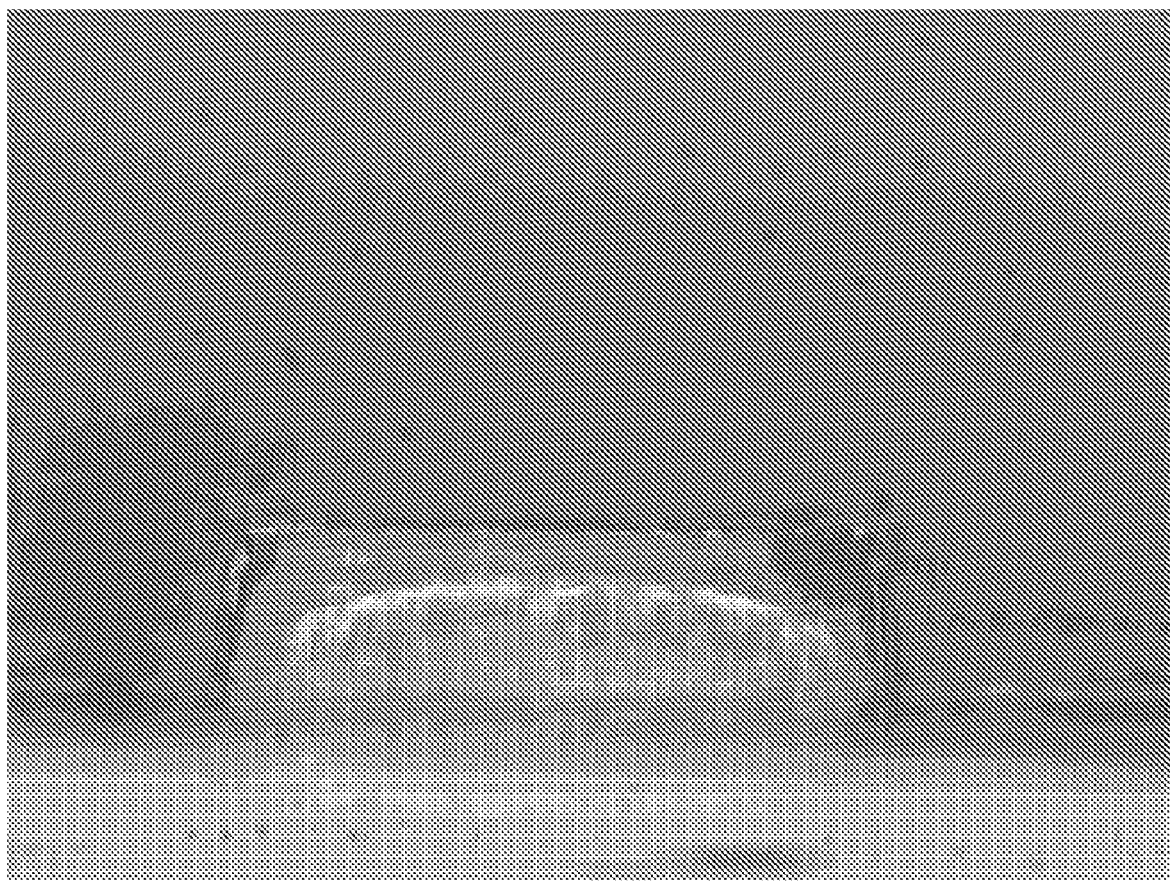
FIG. 5 is a sectional view of a chip encapsulated with the method according to the present invention.

In step (g1), the photoresist-removing agent is a mixture of 1-60% N-Methyl-2-Pyrrolidone (NMP), 1-50% poly(propylene glycol) diamines (PPG-diamine) and 10-30% dimethyl sulfoxide (DMSO) and 1-20% KOH under 40-100 degree C. for 10-60 minutes, preferably 70 degree C. and 20 minutes. In FIGS. 1a to 1e, a plurality of chips 12 are mounted on a top side of a substrate 11 as shown in FIG. 1a and a photoresist 13 is compressed to the top side of the substrate 11 as shown in FIG. 1b. After the exposing and developing steps, the underlying portions of the unexposed photoresist regions are uncovered as shown in FIG. 1c. Then, a molding material is applied to the chips 12 mounted on the top side of the substrate 11 to form a conformal coating 15 as shown in FIG. 1d. In FIG. 1e, the unexposed photoresist regions are removed from the top side of the substrate 11.

According to a preferred embodiment of the invention, the chips are LED chips and the molding material contains one or more phosphors. In this aspect, the present invention provides a method for fabricating a LED device which comprises:
(a2) providing a substrate with a plurality of LED chips mounted on a top side of the substrate in flip-chip manner;
(b2) compressing a dry film photoresist on the top side of the substrate to form a photoresist layer;
(c2) exposing the photoresist layer to a light source through a mask to form unexposed photoresist regions and exposed photoresist regions;
(d2) developing the photoresist layer to uncover underlying portions of the unexposed photoresist regions;
(e2) molding the top side of the substrate with a molding material containing one or more phosphors;
(f2) curing the molding material; and
(g2) removing the unexposed photoresist regions from the substrate with a photoresist-removing agent.

In step (e2), any known phosphor applicable to the fabrication of LED devices can be used in the present invention. Exemplary phosphors are seen in, for example, EP 1 854 864A1.

EXAMPLES

The invention will become apparent with reference to the following examples, which are purely exemplary and should not be taken to limit the scope of the invention as described in the claims.

Example 1

Dry Film Lamination
Prepare one sapphire substrate mounted with flip chips and clean with DI water to remove potential contaminant. The speed, temperature and pressure of dry film photoresist laminator is controlled under 1 m/min, 120 degree C. and 4 kg/cm2 respectively. G2

Exposure and Development
Using an UV exposure unit and photolithographic mask to expose the substrate with dry film photoresist, DuPont MPF® WB2100, and then develop the photoresist by 1% sodium carbonate under 30 degree C. to define the remaining photoresist area for next process.

Screen Printing and Cure
Mixing 1 part of phosphor power with 5 parts of uncured silicon solution in a 100 ml beaker. Using squeegee of a screen printer to print the phosphor silicon solution into photoresist via/trench on the substrate and then cure the silicon under 150 degree C. for 8 hours.

Photoresist Removing
After the silicon is fully cured, strip the dry film photoresist with DuPont EKC 830 remover under 80 degree C. for 15 minutes and then rinsing the substrate with Di water to remove the remaining solvent.

Example 2

Dry Film Lamination
Prepare one glass wafer and clean it with Di water to remove potential contaminant. The speed, temperature and pressure of dry film photoresist laminator is controlled under 2 m/min, 105 degree C. and 3 kg/cm2 respectively.

Exposure and Development
Using an UV exposure unit and photolithographic mask to expose the substrate with dry film photoresist, DuPont MPF® WBR2120, and then develop the photoresist by 1% sodium carbonate under 30 degree C. to define the remaining photoresist area for next process.

Screen Printing and Cure
Mixing 1 part of phosphor power with 5 parts of uncured silicon solution in a 100 ml beaker. Using squeegee of a screen printer to print the phosphor silicon solution into photoresist via/trench on the substrate and then cure the silicon under 150 degree C. for 8 hours.

Photoresist Removing
After the silicon is fully cured, strip the dry film photoresist with DuPont EKC 830 remover under 60 degree C. for 15 minutes and then rinsing the substrate with DI water to remove the remaining solvent.

Example 3

Dry film Lamination
Prepare one silicon substrate with topography ranging from 5 um to 150 um and then clean with DI water to remove potential contaminant. The speed, temperature and pressure of dry film photoresist laminator is controlled under 0.5 m/min, 120 degree C. and 5 kg/cm2 respectively.

Exposure and Development
Using an UV exposure unit and photolithographic mask to expose the substrate with dry film photoresist, DuPont MPF® WBR2120, and then develop the photoresist by 1% sodium carbonate under 30 degree C. to define the remaining photoresist area for next process.

Screen Printing and Cure
Mixing 1 part of phosphor power with 5 parts of uncured silicon solution in a 100 ml beaker. Using squeegee of a screen printer to print the phosphor silicon solution into photoresist via/trench on the substrate and then cure the silicon under 150 degree C. for 8 hours.

Photoresist Removing
After the silicon is fully cured, strip the dry film photoresist with DuPont EKC 830 remover under 100 degree C. for 60 minutes and then rinsing the substrate with DI water to remove the remaining solvent.

What is claimed is:

1. A method for encapsulating a substrate, which comprises:
    (a1) providing a substrate with a plurality of chips mounted on a top of the substrate;
    (b1) compressing a dry film photoresist on the top side of the substrate to form a photoresist layer;
    (c1) exposing the photoresist layer to a light source through a mask to form unexposed photoresist regions and exposed photoresist regions;
    (d1) developing the photoresist layer to uncover underlying portions of the unexposed photoresist regions;
    (e1) molding the top side of the substrate with a molding material;
    (f1) curing the molding material; and
    (g1) removing the unexposed photoresist regions from the substrate with a photoresist-removing agent.

2. The method of claim 1, wherein the substrate is selected from the group consisting of an indium tin oxide (ITO) glass and ceramics.

3. The method of claim 1, wherein the chips are mounted on the substrate in flip-chip manner.

4. The method of claim 3, wherein the chips are LED chips.

5. The method of claim 1, wherein the chips are mounted on the substrate in wirebond manner.

6. The method of claim 1, wherein step (d1) is carried out by using an aqueous solution of sodium carbonate having a concentration of 0.1 to 1.5 v/v % as a developing solution.

7. The method of claim 1, wherein in step (e1), the molding materials form a conformal coating on the chips mounted on the top side of the substrate.

8. The method of claim 1, wherein the curing of the step (f1) is carried out by heating the substrate.

9. The method of claim 1, wherein the curing of step (f1) is carried out by subjecting the substrate to a light source.

10. The method of claim 1, wherein the photoresist-removing agent used in step (g1) is a mixture of N-Methyl-2-Pyrrolidone (NMP), poly(propylene glycol) diamines (PPG-diamine) and dimethyl sulfoxide (DMSO).

11. A method of fabricating a LED device, which comprises:
    (a2) providing a substrate with a plurality of LED chips mounted on a top side of the substrate in flip-chip manner;
    (b2) compressing a dry film photoresist on the top side of the substrate to form a photoresist layer;
    (c2) exposing the photoresist layer to a light source through a mask to form unexposed photoresist regions and exposed photoresist regions;
    (d2) developing the photoresist layer to uncover underlying portions of the unexposed photoresist regions;
    (e2) molding the top side of the substrate with a molding material;
    (f2) curing the molding material; and
    (g2) removing the unexposed photoresist regions from the substrate with a photoresist-removing agent.

12. The method of claim 11, wherein the substrate is selected from the group consisting of an indium tin oxide (ITO) glass and ceramics.

13. The method of claim 11, wherein step (d1) is carried out by using an aqueous solution of sodium carbonate having a concentration of 0.1 to 1.5 v/v % as a developing solution.

14. The method of claim 11, wherein the step (e2), the molding materials form a conformal coating on the chips mounted on the top side of the substrate.

15. The method of claim 11, wherein the curing of step (f2) is carried out by heating the substrate.

16. The method of claim 11, wherein the curing of step (f2) is carried out by subjecting the substrate to a light source.

* * * * *

UNITED STATES PATENT AND TRADEMARK OFFICE
CERTIFICATE OF CORRECTION

| | | |
|---|---|---|
| PATENT NO. | : 7,939,350 B2 | Page 1 of 1 |
| APPLICATION NO. | : 12/341037 | |
| DATED | : May 10, 2011 | |
| INVENTOR(S) | : Bin-Hong Tsai | |

It is certified that error appears in the above-identified patent and that said Letters Patent is hereby corrected as shown below:

Title page, item [57] Abstract should read as follows:

(g1) removing the ~~un~~exposed photoresist regions from the substrate with a photoresist-removing agent.

Column 3, lines 20-21 should read as follows:

(g1) removing the ~~un~~exposed photoresist regions from the substrate with a photoresist-removing agent.

Column 4, line 6 should read as follows:

In FIG. 1e, the ~~un~~exposed photoresist regions are removed

Column 4, lines 26-27 should read as follows:

(g1) removing the ~~un~~exposed photoresist regions from the substrate with a photoresist-removing agent.

Column 6, lines 4-5 should read as follows:

(g1) removing the ~~un~~exposed photoresist regions from the substrate with a photoresist-removing agent.

Column 6, lines 46-47 should read as follows:

(g1) removing the ~~un~~exposed photoresist regions from the substrate with a photoresist-removing agent.

Signed and Sealed this
Eighteenth Day of December, 2012

David J. Kappos
*Director of the United States Patent and Trademark Office*